(12) United States Patent
Raithel et al.

(10) Patent No.: US 12,708,059 B2
(45) Date of Patent: Aug. 11, 2026

(54) POWER MODULE HAVING A MULTI-LEVEL LEAD FRAME

(71) Applicant: Infineon Technologies AG, Neubiberg (DE)

(72) Inventors: Dominic Raithel, Lappersdorf (DE); Adrian Lis, Regensburg (DE); Thomas Schmid, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 376 days.

(21) Appl. No.: 18/426,415

(22) Filed: Jan. 30, 2024

(65) Prior Publication Data

US 2024/0304527 A1 Sep. 12, 2024

Related U.S. Application Data

(60) Provisional application No. 63/450,148, filed on Mar. 6, 2023.

(51) Int. Cl.
*H10W 90/00* (2026.01)
*H10W 70/40* (2026.01)
*H10W 70/60* (2026.01)
*H10W 70/65* (2026.01)

(52) U.S. Cl.
CPC ........ *H10W 90/811* (2026.01); *H10W 70/427* (2026.01); *H10W 70/429* (2026.01); *H10W 70/451* (2026.01); *H10W 70/481* (2026.01); *H10W 70/611* (2026.01);
(Continued)

(58) Field of Classification Search
CPC ............ H10W 70/427; H10W 70/429; H10W 70/451; H10W 70/461; H10W 70/466; H10W 70/468; H10W 70/481; H10W 70/60; H10W 70/611; H10W 70/65; H10W 90/00; H10W 90/701; H10W 90/811; H10W 40/255; H10W 44/501; H02M 7/003
See application file for complete search history.

(56) References Cited

U.S. PATENT DOCUMENTS

2018/0122725 A1* 5/2018 Im ...................... H10W 70/464
2019/0341332 A1 11/2019 Lin et al.
2020/0035616 A1* 1/2020 Hoegerl ............. H10W 40/255
(Continued)

*Primary Examiner* — Scott B Geyer
(74) *Attorney, Agent, or Firm* — Murphy, Bilak & Homiller, PLLC

(57) ABSTRACT

A power module includes: a first substrate comprising a patterned first metallization; a second substrate comprising a patterned second metallization that faces the patterned first metallization; a first plurality of vertical power transistor dies having a drain pad attached to a first part of the patterned first metallization and a source pad electrically connected to a first part of the patterned second metallization; a second plurality of vertical power transistor dies having a drain pad attached to a second part of the patterned first metallization and a source pad electrically connected to a second part of the patterned second metallization; and a multi-level lead frame between the first substrate and the second substrate and attached to each of the first part of the patterned first metallization, the first part of the patterned second metallization, the second part of the patterned first metallization, and the second part of the patterned second metallization.

13 Claims, 15 Drawing Sheets

(52) U.S. Cl.
CPC .......... *H10W 70/65* (2026.01); *H10W 90/00* (2026.01); *H10W 90/701* (2026.01)

(56) References Cited

U.S. PATENT DOCUMENTS

| | | | | |
|---|---|---|---|---|
| 2021/0167003 | A1* | 6/2021 | Ieiri | H02M 7/003 |
| 2021/0313243 | A1* | 10/2021 | McPherson | H10W 90/00 |
| 2022/0037260 | A1* | 2/2022 | Fuji | H10W 70/481 |
| 2022/0199502 | A1* | 6/2022 | Prajuckamol | H10W 40/255 |
| 2022/0238413 | A1* | 7/2022 | Grassmann | H10W 40/255 |
| 2022/0319976 | A1* | 10/2022 | Tønnes | H02M 7/003 |
| 2022/0344253 | A1* | 10/2022 | Hatano | H10W 70/20 |
| 2023/0253335 | A1* | 8/2023 | Tanikawa | H10W 70/65<br>257/668 |
| 2023/0299066 | A1* | 9/2023 | Lu | H10W 72/50 |
| 2024/0047429 | A1* | 2/2024 | Lis | H10W 90/00 |
| 2024/0250075 | A1* | 7/2024 | Shibuya | H10W 72/073 |
| 2024/0290757 | A1* | 8/2024 | Prajuckamol | H10W 40/255 |

* cited by examiner 184
186
176
192
178
136
128
156
148
140
150
158
146
166
170
160
164
180
108
106
118
152

180
160
166
168
182
162
132, 132b
122, 122b
134
144
154
120
142
172
124
126
190
194
188
104
122, 122a
102
116
132, 132a
138
130
174

POWER MODULE HAVING A MULTI-LEVEL LEAD FRAME

BACKGROUND

Power modules often have a half bridge configuration with a high-side switch and a low-side switch in the same module. Each switch is typically formed from 1 to 4 (or more) power transistor dies (chips), which results in a total of 2 to 8 (or more) dies per module, sandwiched between two die carrier substrates. In the case of SiC transistor dies for implementing the half bridge switches, SiC technology is more expensive compared to Si technology. However, SiC technology delivers higher voltage operation, wider temperature ranges, and increased switching frequencies when compared to existing Si technology. Thermal optimization is an issue with power modules, especially in the case of a fully populated power module with 8 or more SiC transistor dies. Strong thermal coupling between the SiC dies arises since the distances between the single SiC dies are relatively short. Electrically conductive vias outside the perimeter of the SiC transistor dies are typically used to provide power and signal connections between the die carrier substrates, which results in strong thermal coupling between the die carrier substrates. This means that relatively expensive SiC dies and die carrier substrates are not fully exploited with respect to thermal and electrical performance in conventional power module designs.

Hence, there is a need form an improved power module design with better thermal performance.

SUMMARY

According to an embodiment of a power module, the power module comprises: a first substrate comprising a patterned first metallization; a second substrate comprising a patterned second metallization that faces the patterned first metallization; a first plurality of vertical power transistor dies having a drain pad attached to a first part of the patterned first metallization and a source pad electrically connected to a first part of the patterned second metallization; a second plurality of vertical power transistor dies having a drain pad attached to a second part of the patterned first metallization and a source pad electrically connected to a second part of the patterned second metallization; and a lead frame between the first substrate and the second substrate, wherein the first plurality of vertical power transistor dies and the second plurality of vertical power transistor dies form a half bridge, wherein the lead frame comprises: a first lead attached to the first part of the patterned second metallization and providing a low-side current path to the half bridge; a second lead attached to the second part of the patterned first metallization and providing a high-side current path to the half bridge; and a third lead attached to both the first part of the patterned first metallization and the second part of the patterned second metallization, and providing a phase current path to the half bridge.

According to another embodiment of a power module, the power module comprises: a first substrate comprising a patterned first metallization; a second substrate comprising a patterned second metallization that faces the patterned first metallization; a first plurality of vertical power transistor dies having a drain pad attached to a first part of the patterned first metallization and a source pad electrically connected to a first part of the patterned second metallization; a second plurality of vertical power transistor dies having a drain pad attached to a second part of the patterned first metallization and a source pad electrically connected to a second part of the patterned second metallization; and a multi-level lead frame between the first substrate and the second substrate and attached to each of the first part of the patterned first metallization, the first part of the patterned second metallization, the second part of the patterned first metallization, and the second part of the patterned second metallization.

According to another embodiment of a power module, the power module comprises: a first substrate comprising a patterned first metallization; a second substrate comprising a patterned second metallization that faces the patterned first metallization; a first plurality of vertical power transistor dies forming a low-side switch of a half bridge and having a drain pad attached to a first part of the patterned first metallization and a source pad electrically connected to a first part of the patterned second metallization; a second plurality of vertical power transistor dies forming a high-side switch of the half bridge and having a drain pad attached to a second part of the patterned first metallization and a source pad electrically connected to a second part of the patterned second metallization; and a multi-level lead frame attached to both the patterned first metallization and the patterned second metallization and providing a low-side current path, a high-side current path, and a phase current path to the half bridge.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

Each of FIGS. 6A, 7A, 8A, 9A and 10A schematically shows different configurations for the low-side and high-side switch devices formed by the vertical power transistor dies included in the power module.

Each of FIGS. 6B, 7B, 8B, 9B and 10B schematically shows corresponding different configurations for the high-side current path and the phase current path related to the first substrate.

Each of FIGS. 60, 7C, 80, 9C and 10C schematically shows corresponding different configurations for the low-side current path and the phase current path related to the second substrate 106.

Figures 11A, 11B:
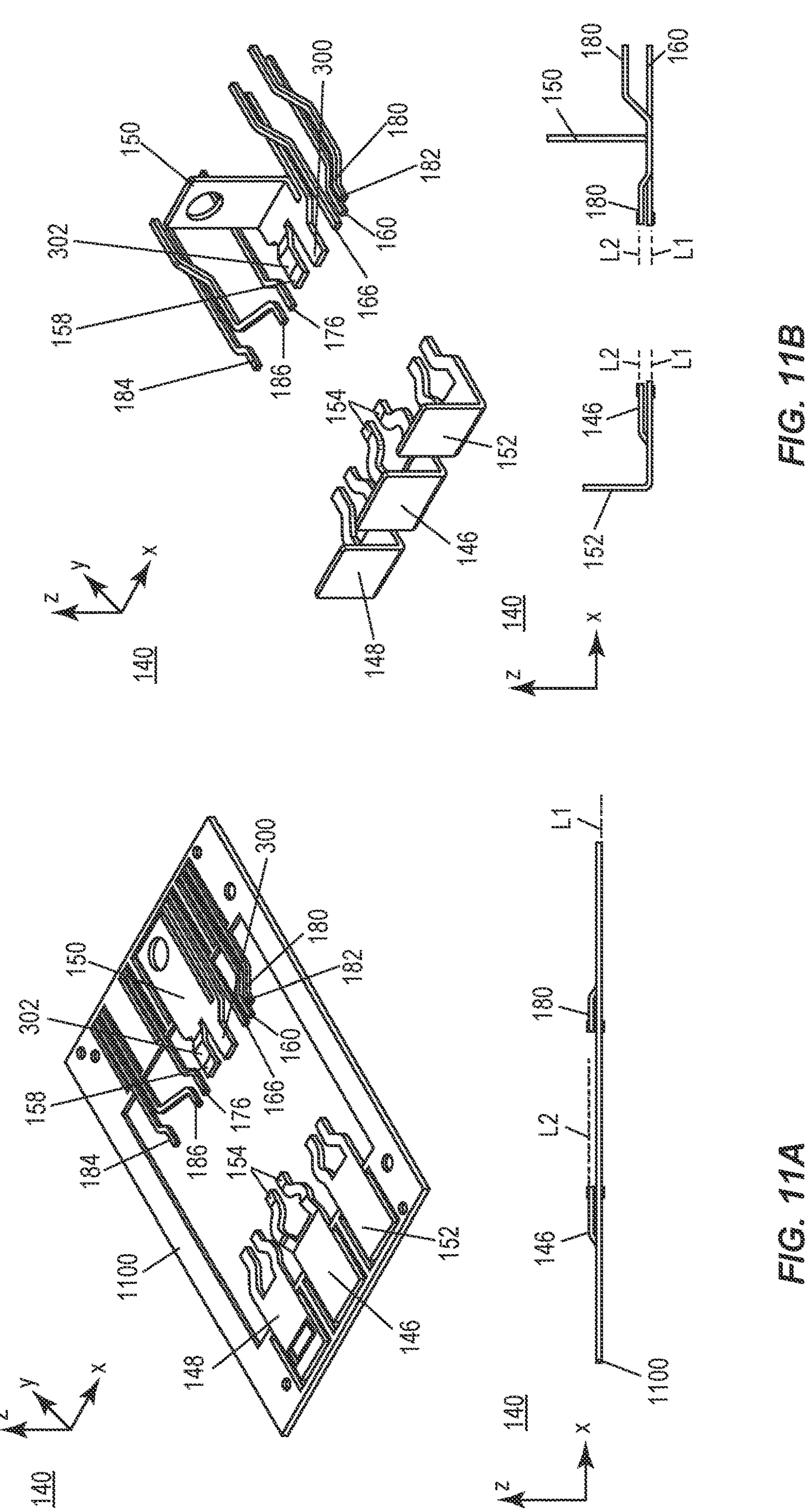

The upper part of FIG. 11A illustrates a top perspective view of the multi-level lead frame included in the power module and the lower part of FIG. 11A illustrates a corresponding side view of the multi-level lead frame, before separation of the leads from a frame of the multi-level lead frame.

The upper part of FIG. 11B illustrates a top perspective view of the multi-level lead frame included in the power module and the lower part of FIG. 11B illustrates a corresponding side view of the multi-level lead frame, after separation of the leads from the frame.

Figure 12:
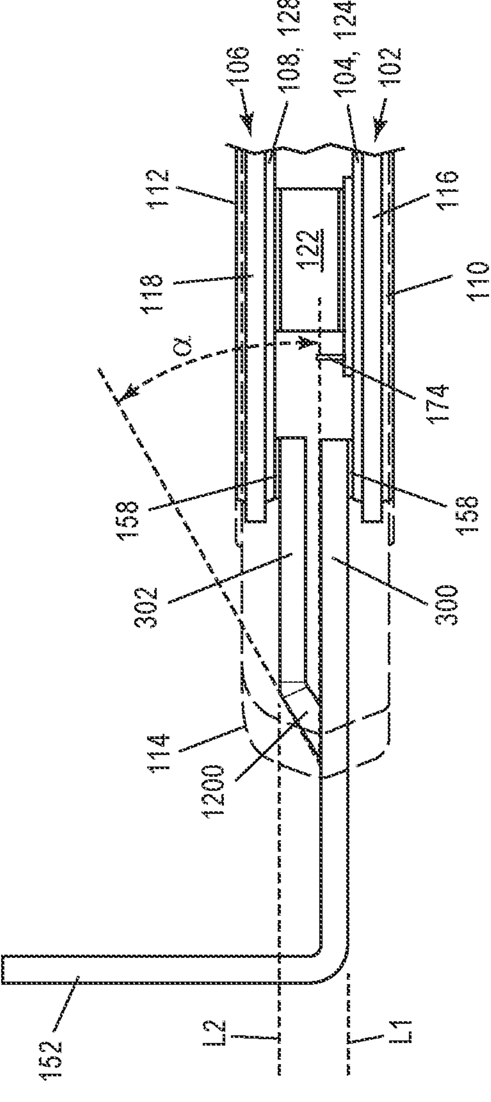
Figure 12:
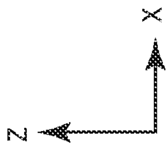

FIG. 12 illustrates a partial cross-sectional view of the power module.

Figure 13:
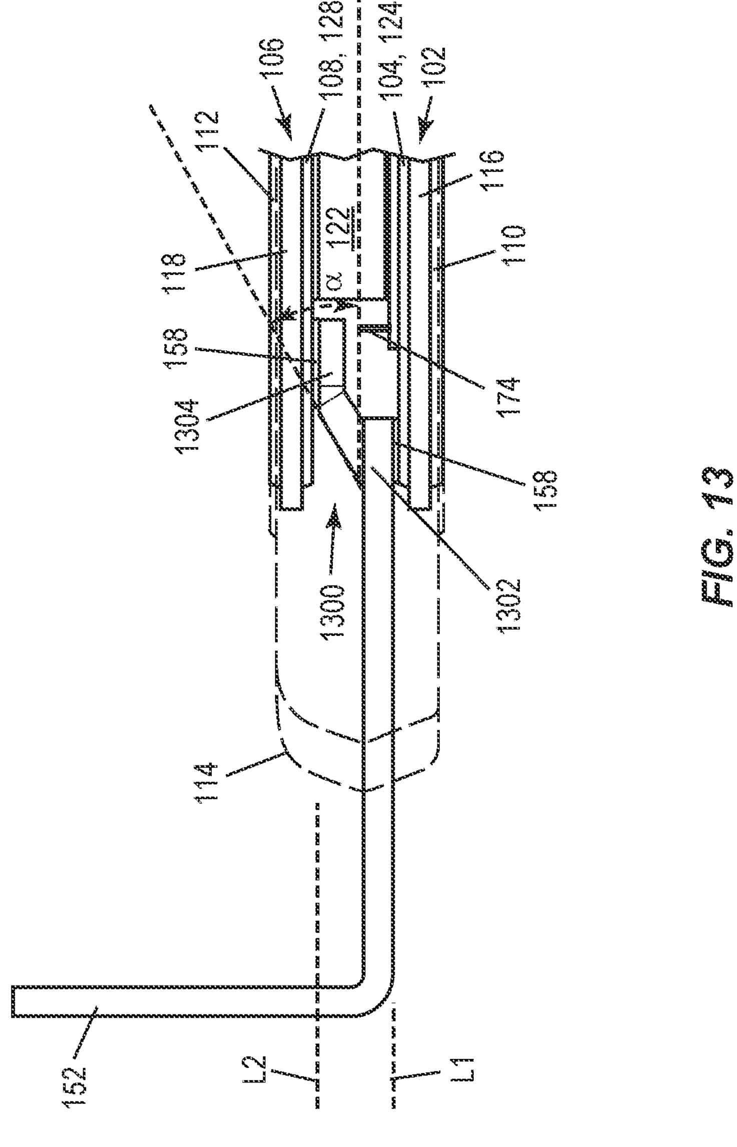

FIG. 13 illustrates a partial cross-sectional view of the power module, according to another embodiment.

Figure 14:
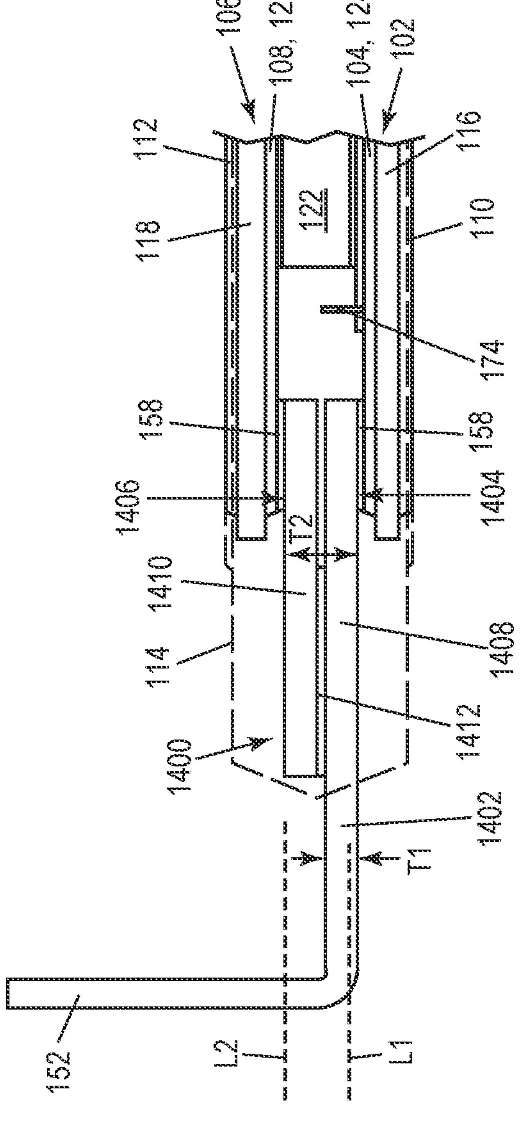
Figure 14:
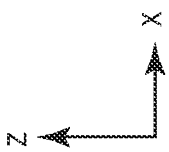

FIG. 14 illustrates a partial cross-sectional view of the power module, according to another embodiment.

DETAILED DESCRIPTION

The embodiments described herein provide a power module design having a multi-level lead frame that attaches to both die carrier substrates included in the power module. The multi-level lead frame eliminates the need for electrically conductive vias that provide power and signal connections between the die carrier substrates. Instead, the multi-level lead frame provides the power and signal connections to both die carrier substrates. The space gained by omitting the electrically conductive vias can be used, e.g. to increase the distance between the power transistor dies included in the module, accommodate additional dies, improve the electrical (e.g., higher output current capacity) and thermal performance, simplify the assembly process, reduce module cost, etc. The power module design supports double-sided cooling where the main heat dissipation of one group of power transistor dies is through one side of the power module via one die carrier substrate and the main heat dissipation another group of vertical power transistor dies is through the opposite side of the module via the other die carrier substrate. The power module design may support single-side cooling instead of double-sided cooling.

Described next, with reference to the figures, are exemplary embodiments of the power module design and corresponding methods of production. Any of the power module embodiments described herein may be used interchangeably unless otherwise expressly stated.

Figure 1B:
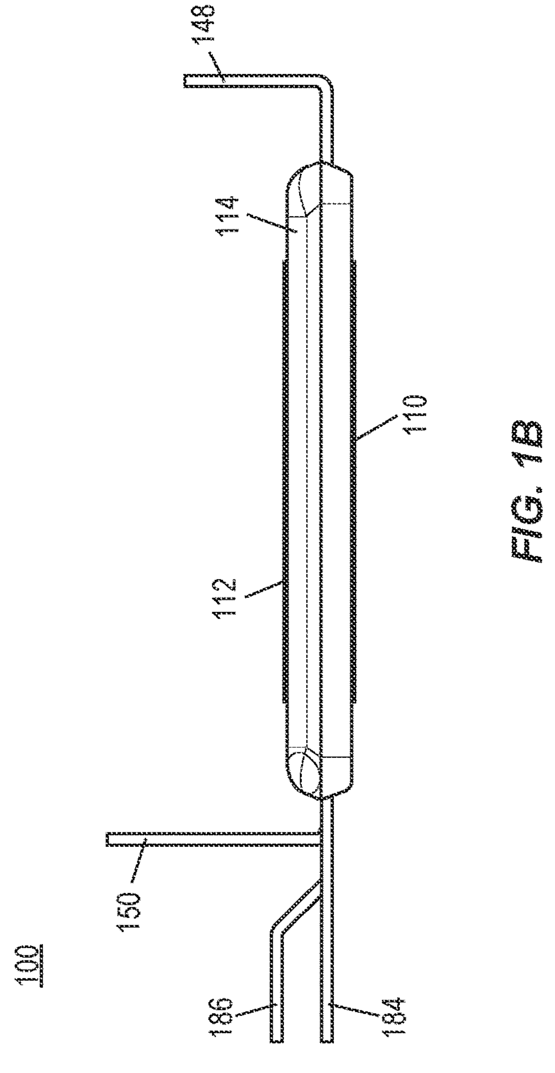
FIG. 1B illustrates a side view of the power module.
Figure 1A:
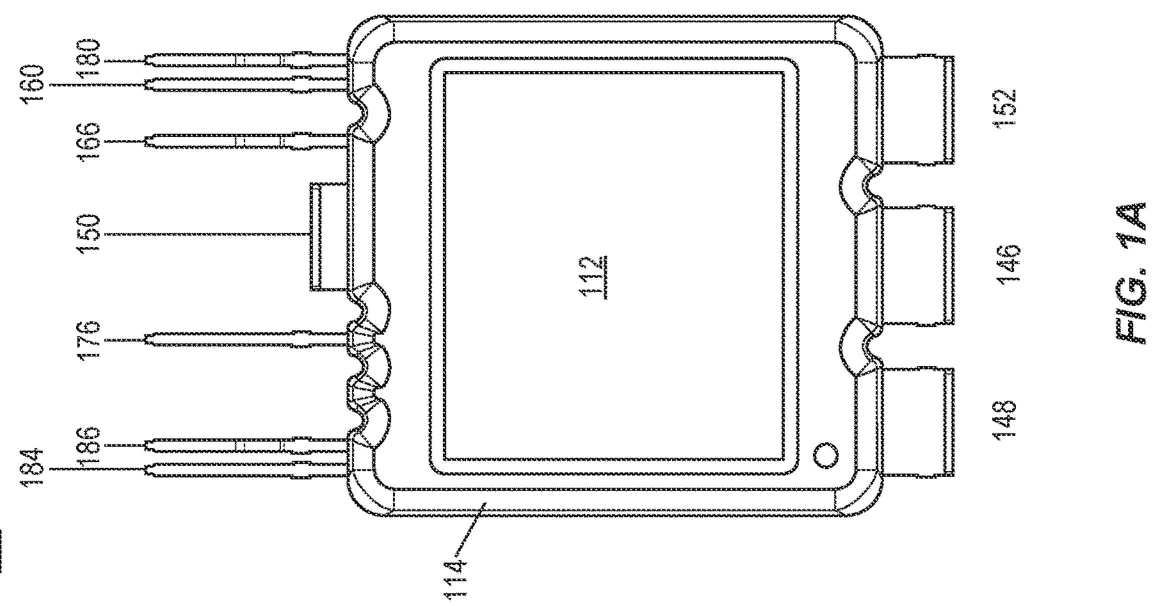
FIG. 1A illustrates a plan view of an embodiment of a power module having a multi-level lead frame.
Figures 1C, 1D:
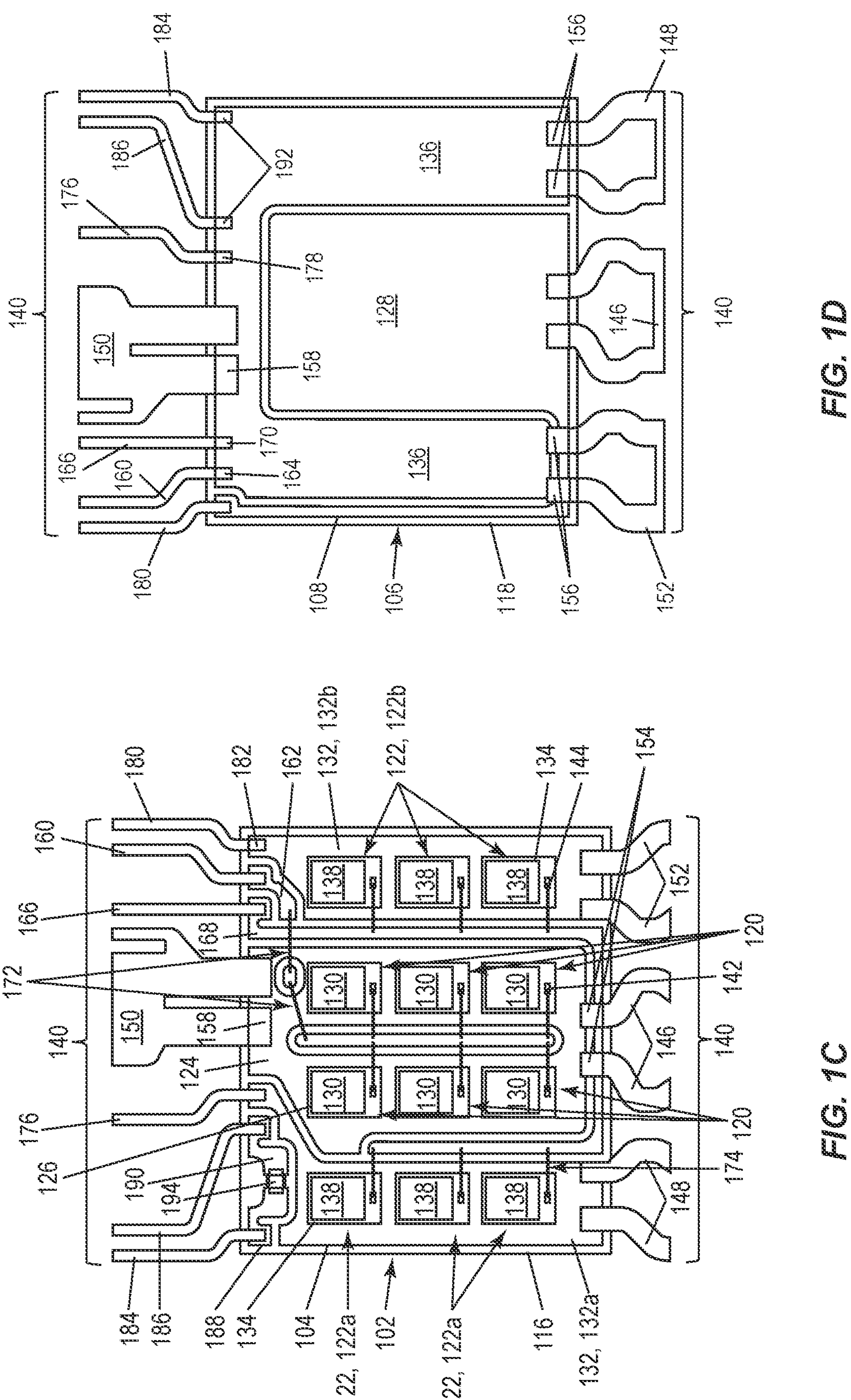
FIGS. 1C and 1D illustrates different disassembled views of the power module.

FIG. 1A illustrates a plan view of an embodiment of a power module 100. FIG. 1B illustrates a side view of the power module 100. FIGS. 1C and 1D illustrate different disassembled views of the power module 100. The power module 100 may form part of a power electronics circuit for use in various power applications such as in a DC/AC inverter, a DC/DC converter, an AC/DC converter, a DC/AC converter, an AC/AC converter, a multi-phase inverter, an H-bridge, DC motor drive, etc.

The power module 100 includes a first (die carrier) substrate 102 having a patterned first metallization 104 and a second (die carrier) substrate 106 vertically aligned with the first substrate 102. The second substrate 106 has a patterned second metallization 108 that faces the patterned first metallization 104 of the first substrate 102. FIGS. 1C and 1D show the first and second substrates 102, 106, respectively, with the second substrate 106 being flipped in FIG. 1D so that the patterned second metallization 108 which faces the first die carrier substrate 102 is visible. Both substrates 102, 106 may have a patterned or un-patterned metallization 110, 112 at the respective opposite side of each substrate 102, 106, e.g., as shown in FIGS. 1A and 1B to provide double-sided cooling. One of these non-facing substrate metallizations 110, 112 may be covered by a mold body 114 such that the power module 100 instead provides single-sided cooling.

The substrate metallizations 104, 108 that face one another are patterned to ensure proper routing of electrical connections for implementing a power electronics device included in the power module 100. Exemplary electrical connections are described in more detail later in the context of a half bridge. However, a half bridge is just one example of a power electronics device that may be included in the power module 100. The substrate metallizations 104, 108 that face one another may be patterned differently than what is illustrated in the figures, to facilitate electrical connections for any type of power electronics device included in the power module 100.

The first substrate 102 may be a direct bonded copper (DBC) substrate, an active metal brazed (AMB) substrate, or an insulated metal (IMS) substrate, where in each case an insulating body 116 such as a ceramic separates the metallized sides 104, 110 of the first substrate 102 from one another. The second substrate 106 may be a DBC substrate, an AMB substrate, or an IMS substrate, where in each case an insulating body 118 such as a ceramic separates the metallized sides 108, 112 of the second substrate 106 from one another. The insulating body 116 of the second substrate 106 instead may be omitted such that the second substrate 106 includes just a patterned metallization 108, e.g., such as a lead frame. The first and second substrates 102, 106 may be the same substrate type or different substrate types. The first substrate 102 and the second substrate 106 may have identical areas or different areas. In FIGS. 1C and 1D, the first and second substrates 102, 106 are shown side-by-side before the second substrate 106 is flipped from right to left and aligned vertically with the first substrate 102.

The power module 100 also includes first vertical power transistor dies 120 and second vertical power transistor dies 122. The power transistor dies 120, 122 are 'vertical' dies in that the primary current flow path is between the front and back sides of each die 120, 122. The drain terminal is typically disposed at the die backside, with gate and source terminals (and optionally one or more sense terminals) at the die frontside. Additional types of semiconductor dies may be included in the power module 100, such as power diode dies, logic dies, controller dies, gate driver dies, etc. In one embodiment, the first vertical power transistor dies 120 are SiC power MOSFET (metal-oxide-semiconductor field-effect transistor) dies and the second vertical power transistor dies 122 are also SiC power MOSFET dies. The first and second vertical power transistor dies 120, 122 instead may be Si power MOSFET dies, HEMT (high-electron mobility transistor) dies, IGBT (insulated-gate bipolar transistor) dies, JFET (junction filed-effect transistor) dies, etc.

The first vertical power transistor dies 120 included in the power module 100 may have a drain pad (out of view) attached to a first part 124 of the patterned first metallization 104 of the first substrate 102. At the opposite side, the first vertical power transistor dies 120 have a source pad 126 electrically connected to a first part 128 of the patterned second metallization 108 of the second substrate 106 via electrically conductive first spacers 130. The first spacers 130 may be attached to the source pad 126 of the first vertical power transistor dies 120 by a first attach material such as solder, diffusion solder, glue, adhesive, etc. The first spacers 130 may be attached to the first part 128 of the patterned second metallization 108 of the second substrate 106 by a second attach material such as solder, diffusion solder, glue, adhesive, etc. The first and second attach materials may comprise the same material or different materials.

The second vertical power transistor dies 122 included in the power module 100 may have a drain pad (out of view) attached to a second part 132 of the patterned first metallization 104 of the first substrate 102. At the opposite side, the second vertical power transistor dies 122 may have a source pad 134 electrically connected to a second part 136 of the patterned second metallization 108 of the second substrate 106 via electrically conductive second spacers 138. The second spacers 138 may be attached to the source pad 134 of the second vertical power transistor dies 122 by a first attach material such as solder, diffusion solder, glue, adhesive, etc. The second spacers 138 may be attached to the second part 136 of the patterned second metallization 108 of the second substrate 106 by a second attach material such as solder, diffusion solder, glue, adhesive, etc. The first and second attach materials may comprise the same material or different materials.

The die spacers 130, 138 may comprise, e.g., AlSiC which is an aluminum matrix with silicon carbide particles and where AlSiC exhibits very poor solder wetting. Other thermally and electrically conductive materials may be used for the spacers 130, 130, e.g., such as Cu, Al, etc.

Figure 2:
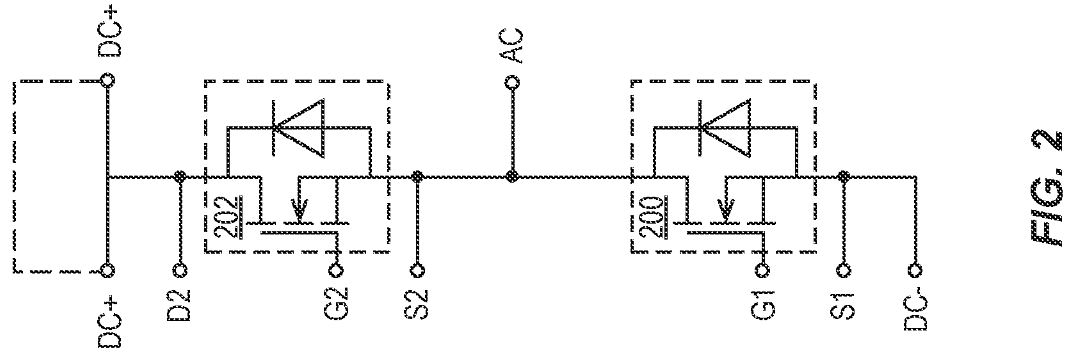
FIG. 2 illustrates a schematic view of a half bridge implemented by vertical power transistor dies included in the power module.

The power module 100 also includes a multi-level lead frame 140 between the first and second substrates 102, 106. The multi-level lead frame 140 is attached to both the patterned first metallization 104 of the first substrate 102 and the patterned second metallization 108 of the second substrate 106. As explained above, the first vertical power transistor dies 120 and the second vertical power transistor dies 122 may form a half bridge. For example, as schematically illustrated in FIG. 2, the first vertical power transistor dies 120 may be electrically coupled in parallel to form a low-side switch device 200 of the half bridge and the second vertical power transistor dies 122 may be electrically coupled in parallel to form a high-side switch device 202 of the half bridge. The low-side and high-side switch devices 200, 202 are schematically illustrated in FIG. 2 as a power MOSFET with a freewheeling diode, as an example.

In the half bridge example, the multi-level lead frame 140, which is attached to both the patterned first metallization 104 of the first substrate 102 and the patterned second metallization 108 of the second substrate 106, provides a low-side current path (DC−), a high-side current path (DC+), and a phase current path (AC) to the half bridge. The multi-level lead frame 140 may also provide a gate signal path (G1) for the gate pad 142 of each first vertical power transistor die 120 and a gate signal path (G2) for the gate pad 144 of each second vertical power transistor die 122. The multi-level lead frame 140 may further provide a source sense path (S1) for the first vertical power transistor dies 120, a source sense path (S2) for the second vertical power transistor dies 122, and a drain sense path (D2) for the second vertical power transistor dies 122.

Continuing with the half bridge example, the multi-level lead frame 140 may include a first lead 146 attached to the first part 128 of the patterned second metallization 108 of the second substrate 106 for providing the low-side current path (DC−) to the half bridge. The multi-level lead frame 140 may also include a second lead 148 attached to the second part 132 of the patterned first metallization 104 of the first substrate 102 for providing the high-side current path (DC+) to the half bridge. The multi-level lead frame 140 may further include a third lead 150 attached to both the first part 124 of the patterned first metallization 104 of the first substrate 102 and the second part 136 of the patterned second metallization 108 of the second substrate 106 for providing the phase current path (AC) to the half bridge.

In FIG. 1C, the first vertical power transistor dies 120 are flanked on one side by a first subset 122*a* of the second vertical power transistor dies 122 and flanked on the opposite side by a second subset 122*b* of the second vertical power transistor dies 122. According to this embodiment, the drain of each vertical power transistor die 122 in the first subset 122*a* is attached to a first segment 132*a* of the second part 132 of the patterned first metallization 104 of the first substrate 102 and the drain of each vertical power transistor die 122 in the second subset 122*b* is attached to a second segment 132*b* of the second part 132 of the patterned first metallization 104 of the first substrate 102. The first part 124 of the patterned first metallization 104 of the first substrate 102 is laterally interposed between the first segment 132*a* and the second segment 132*b* of the second part 132 of the patterned first metallization 104 of the first substrate 102.

The second lead 148 of the multi-level lead frame 140 is attached to the first segment 132*a* of the second part 132 of the patterned first metallization 104 of the first substrate 102. In this example, the multi-level lead frame 140 further includes a fourth lead 152 attached to the second segment 132*b* of the second part 132 of the patterned first metallization 104 of the first substrate 102. The second lead 148 of the multi-level lead frame 140 provides the high-side current path (DC+) to the first subset 122*a* of the second vertical power transistor dies 122 and the fourth lead 152 of the multi-level lead frame 140 provides the high-side current path (DC+) to the second subset 122*b* of the second vertical power transistor dies 122.

As shown in FIGS. 1C and 1D, the first lead 146 of the multi-level lead frame 140 may be attached to the first part 128 of the patterned second metallization 108 of the second substrate 106 by solder 154. The second lead 148 and the fourth lead 152 of the multi-level lead frame 140 may be attached to the second part 132 of the patterned first metallization 104 of the first substrate 102 by solder 156. The third lead 150 of the multi-level lead frame 140 may be attached to both the first part 124 of the patterned first metallization 104 of the first substrate 102 and the second part 136 of the patterned second metallization 108 of the second substrate 106 by solder 158.

The multi-level lead frame 140 may include additional leads. For example, a first gate lead 160 of the multi-level lead frame 140 may be attached to a third part 162 of the patterned first metallization 104 of the first substrate 102, e.g., by solder 164 to provide the gate signal path (G1) for the gate pad 142 of each first vertical power transistor die 120. A second gate lead 166 of the multi-level lead frame 140 may be attached to a fourth part 168 of the patterned first metallization 104 of the first substrate 102, e.g., by solder 170 to provide the gate signal path (G2) for the gate pad 144 of each second vertical power transistor die 122. The gate pad 142 of each first vertical power transistor die 120 is electrically connected to the third part 162 of the patterned first metallization 104 of the first substrate 102, e.g., by one or more bond wires 172. The gate pad 144 of each second vertical power transistor die 122 is electrically connected to the fourth part 168 of the patterned first metallization 104 of the first substrate 102, e.g., by one or more bond wires 174.

A first sense lead 176 of the multi-level lead frame 140 may be attached to the second part 132 of the patterned first metallization 104 of the first substrate 102, e.g., by solder 178 to provide the source sense path (S1) for the first vertical power transistor dies 120. A second sense lead 180 of the multi-level lead frame 140 may be attached to the first part 128 of the patterned second metallization 108 of the second substrate 105, e.g., by solder 182 to provide the source sense path (S2) for the second vertical power transistor dies 122. Two additional leads 184, 186 of the multi-level lead frame 140 may be attached to respective additional parts 188, 190 of the patterned first metallization 104 of the first substrate 102, e.g., by solder 192 to electrically contact opposite terminals of a thermal sensor 194 such as an NTC (negative temperature coefficient) thermistor.

Figure 3:
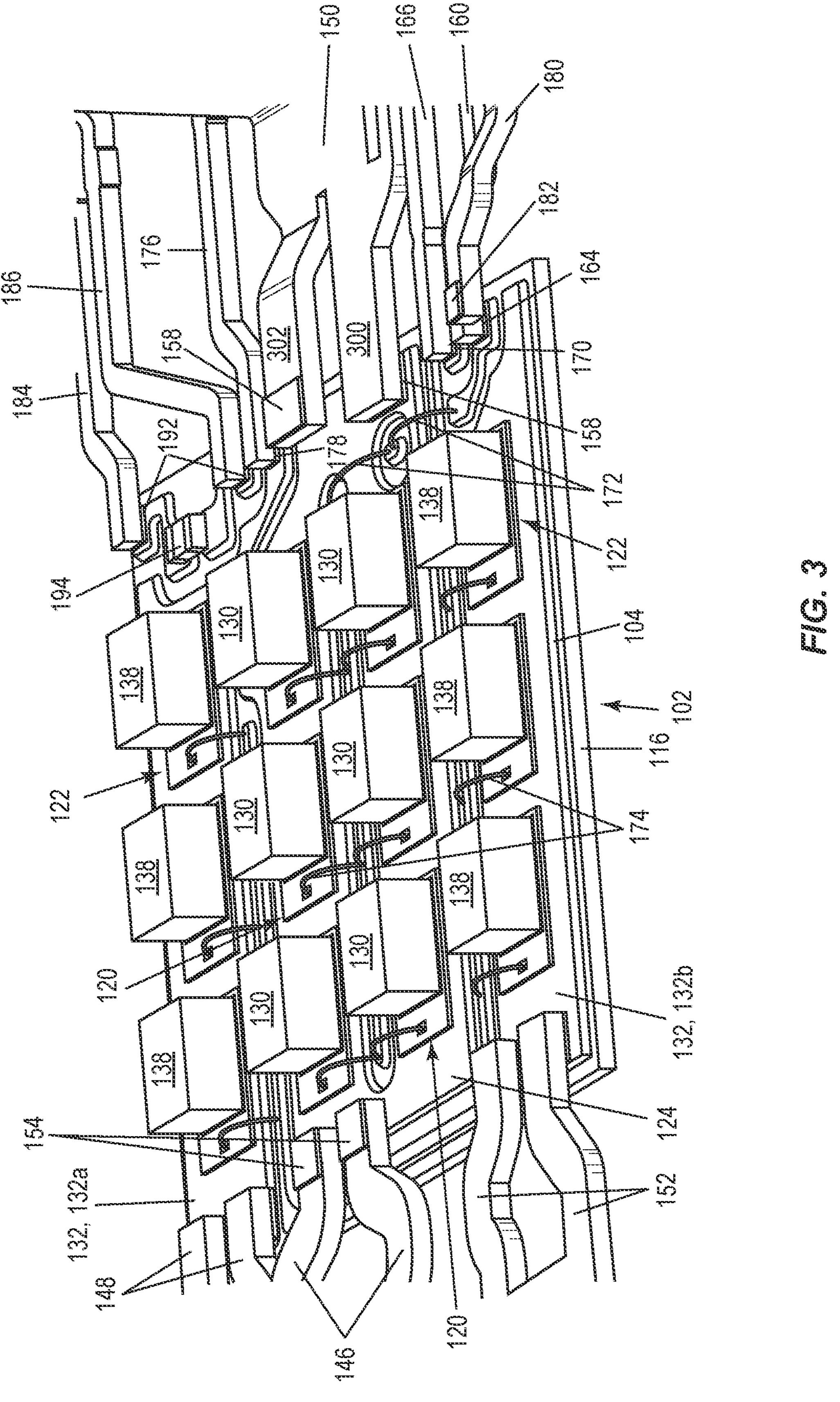
FIG. 3 illustrates a side perspective view of a first die carrier substrate included in the power module.

FIG. 3 illustrates a side perspective view of the first substrate 102. As shown in FIG. 3, the proximal (attached) end of some leads 148, 152, 160, 166, 176, 184, 186 of the multi-level lead frame 140 are at a first (lower) level and attached to the patterned first metallization 104 of the first substrate 102. The proximal end of other the leads 146, 180 of the multi-level lead frame 140 are at a second (upper) level and attached to the patterned second metallization 108 of the second substrate 106 which is not shown in FIG. 3.

In one embodiment, the proximal (substrate attachment) end of the lead 150 of the multi-level lead frame 140 that provides the phase current path (AC) is a split end. The split end has a first part 300 at the lower level and attached to the first part 124 of the patterned first metallization 104 of the first substrate 102. The split end also has a second part 302 at the upper level and attached to the second part 136 of the patterned second metallization 108 of the second substrate 106. A gap 304 is present in the split end, between the first (lower) part 300 and the second (upper) part 302 of the phase current path lead 150. The distal (external) end of the leads 146, 148, 150, 152, 160, 166, 176, 180, 184, 186 are not embedded in the mold body 114, e.g., as shown on FIGS. 1A and 1B, to provide points of external electrical contact to the power module 100.

Figure 4B:
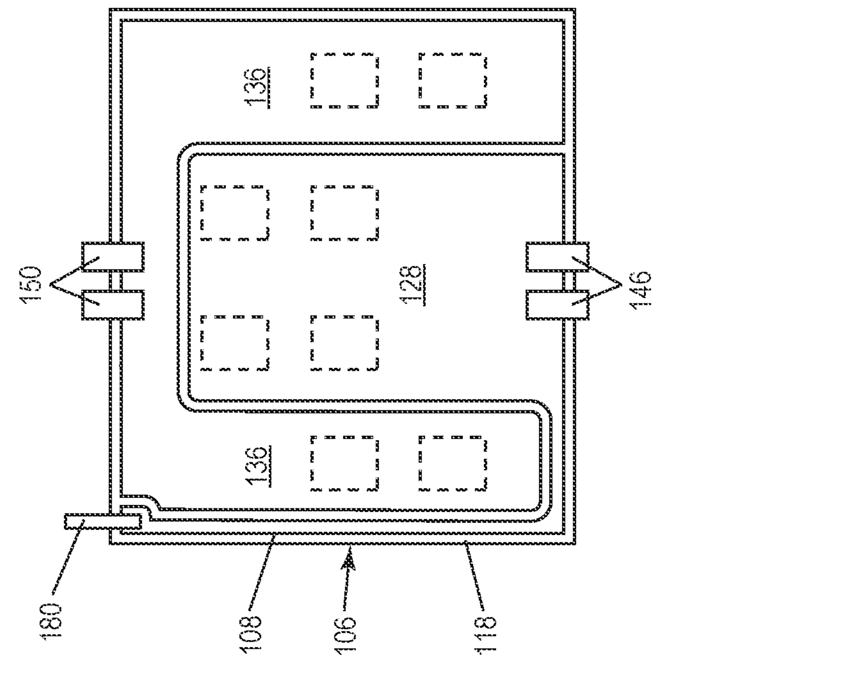
FIG. 4B illustrates a plan view of a second die carrier substrate included in the power module.
Figure 4A:
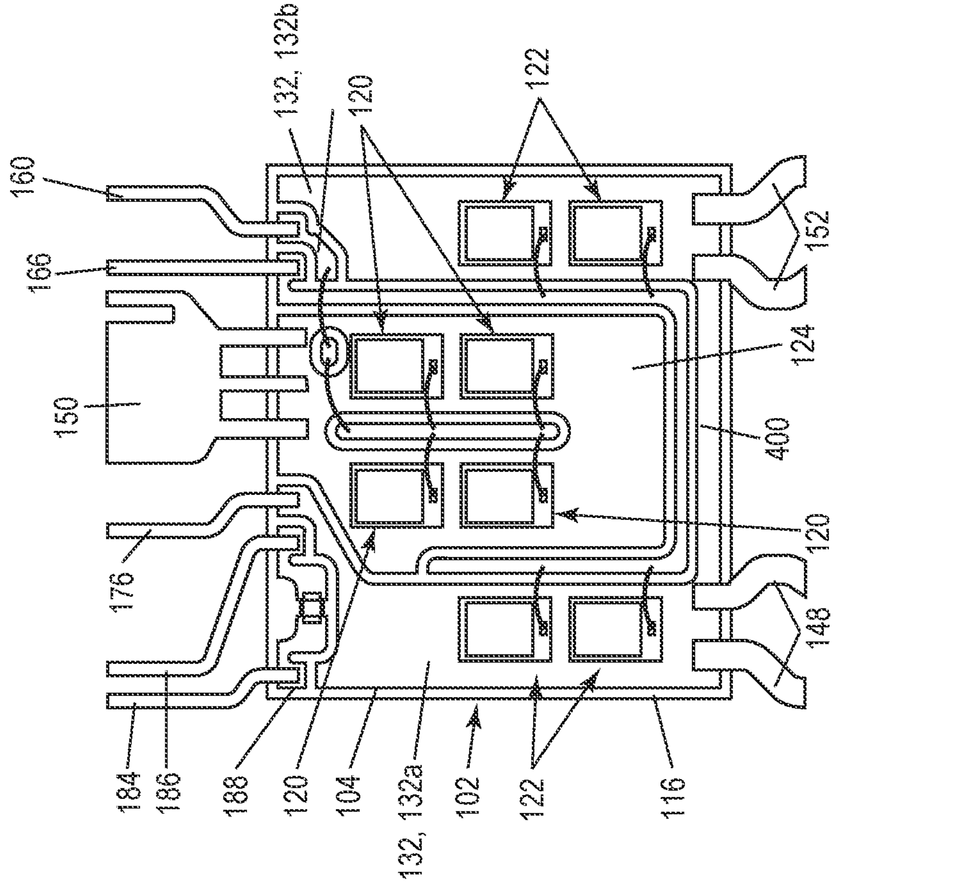
FIG. 4A illustrates a plan view of the first die carrier substrate included in the power module.

FIGS. 4A and 4B show a plan view of the first (FIG. 4A) and second (FIG. 4B) substrates 102, 106 included in the power module 100. According to this embodiment, the first segment 132*a* and the second segment 132*b* of the second part 132 of the patterned first metallization 104 of the first substrate 102 are interconnected by an additional part 400 of the patterned first metallization 104. In FIG. 4B, the dashed rectangles indicate where the die spacers 130, 138 contact the patterned second metallization 108 of the second substrate 106.

In FIGS. 1A through 4B, the only spacers include in the power module 100 are die spacers 130, 138 for electrically connecting the source pads 126, 134 of the vertical power transistor dies 120, 122 to the patterned second metallization 108 of the second substrate 106. The module configuration shown in FIGS. 1A through 4B with reduced spacer usage lowers loop inductance, yielding lower stray inductance. Additional chip area also becomes available by omitting via spacers. Further, the module outline (pin-out, mold body, etc.) is unaffected. More generally, the space gained by omitting via spacers can be used, e.g. to increase the distance between the power transistor dies 120, 122 included in the power module 100, accommodate additional dies, improve the electrical (e.g., higher output current capacity) and thermal performance of the power module 100, simplify the module assembly process, reduce module cost, etc.

Figures 5A, 5B, 5C:
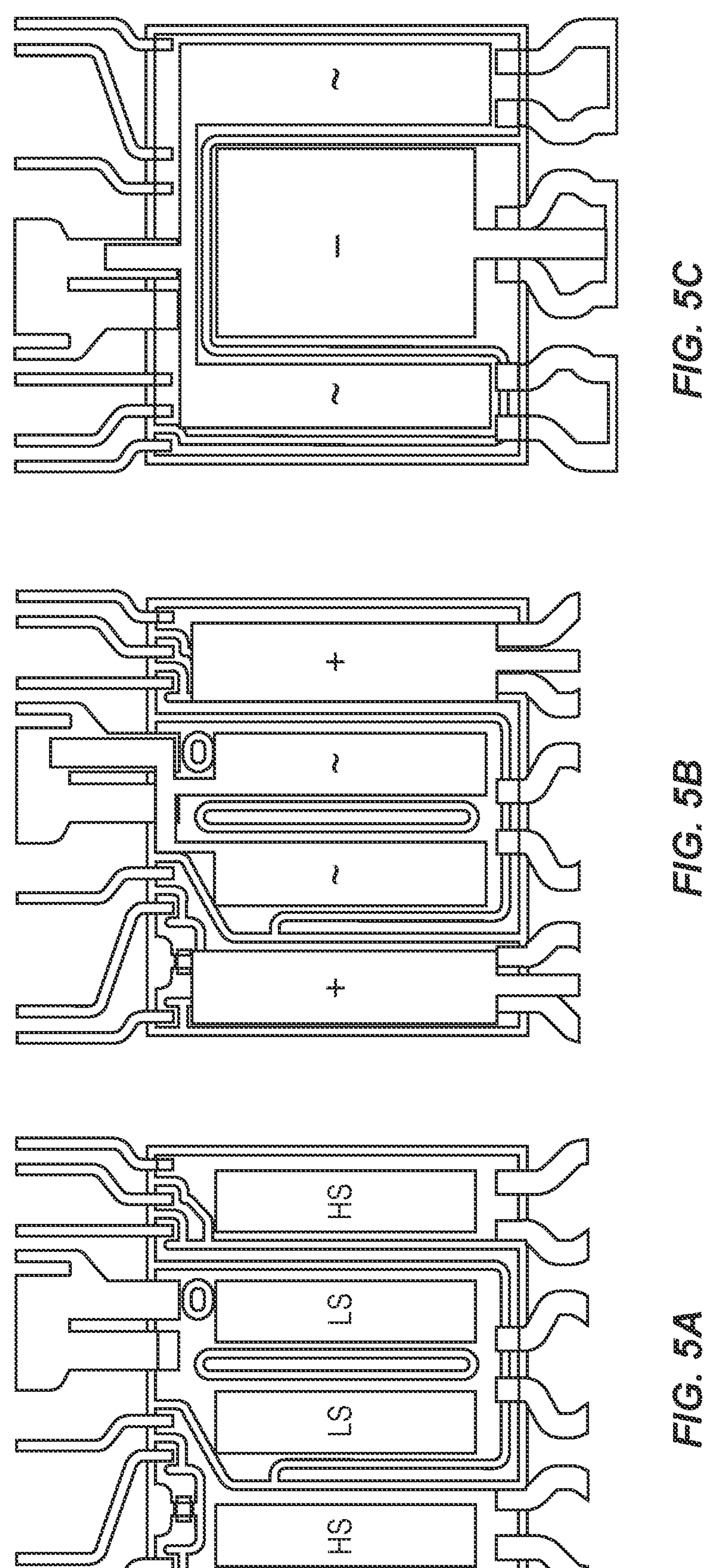
FIG. 5A illustrates the same view as FIG. 1C, but schematically shows low-side and high-side switch devices formed by the vertical power transistor dies included in the power module, superimposed on the first substrate.
FIG. 5B is similar to FIG. 5A, but with a high-side current path and a phase current path superimposed on the first substrate.
FIG. 5C is similar to FIG. 5B, but with a low-side current path and the phase current path superimposed on the second substrate.
Figure 6C:
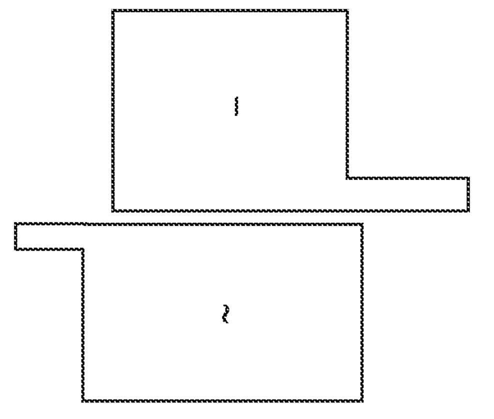
Figure 6C:
Figure 6B:
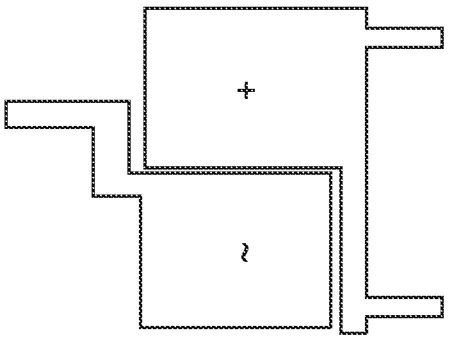
Figure 6A:
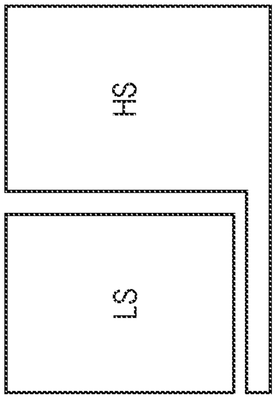
Figure 7C:
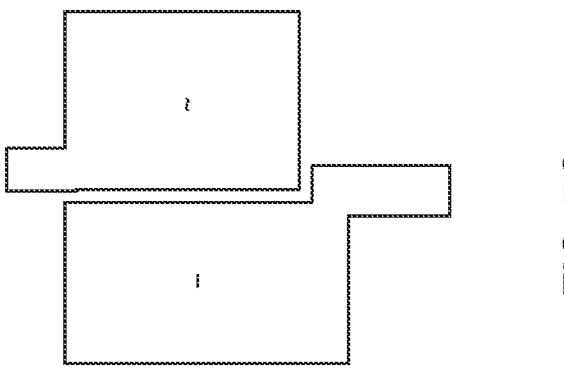
Figure 7B:
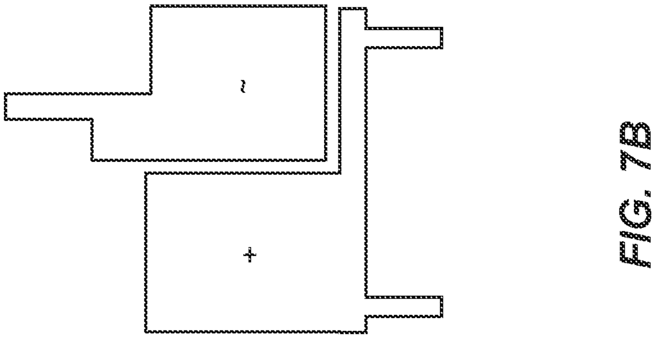
Figure 7A:
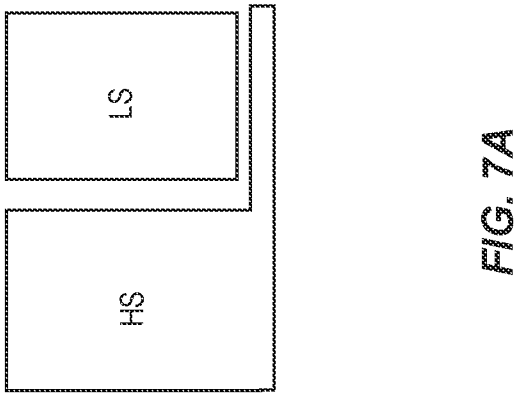
Figure 8C:
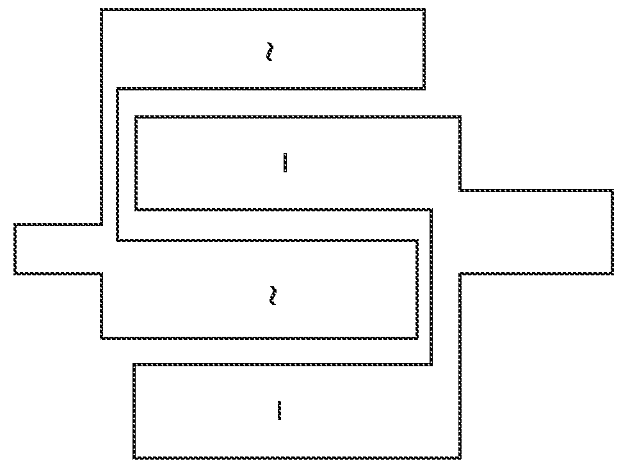
Figure 8C:
Figure 8B:
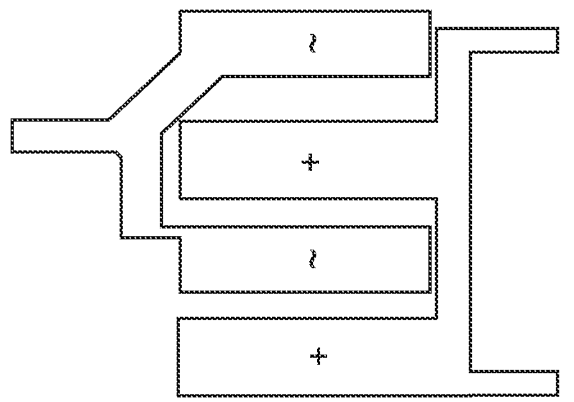
Figure 8A:
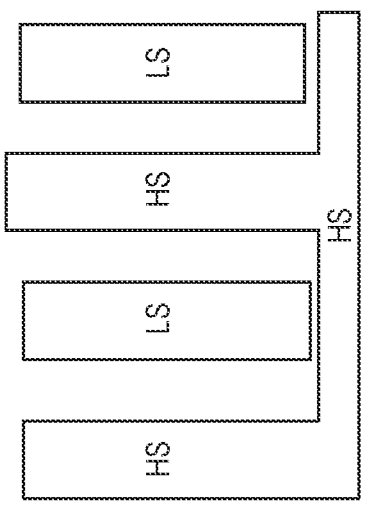
Figure 9C:
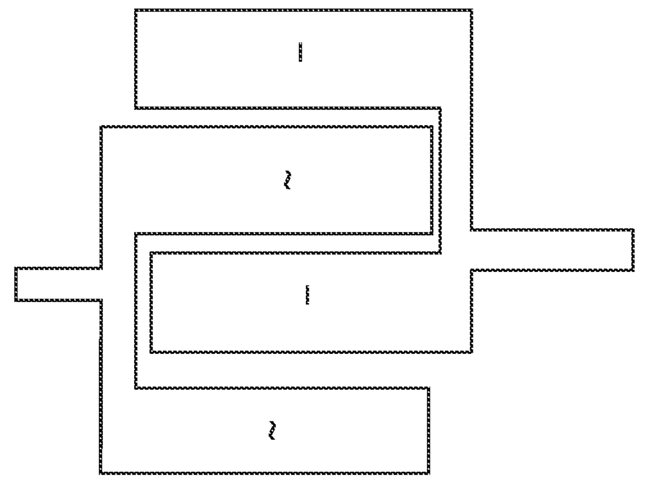
Figure 9C:
Figure 9B:
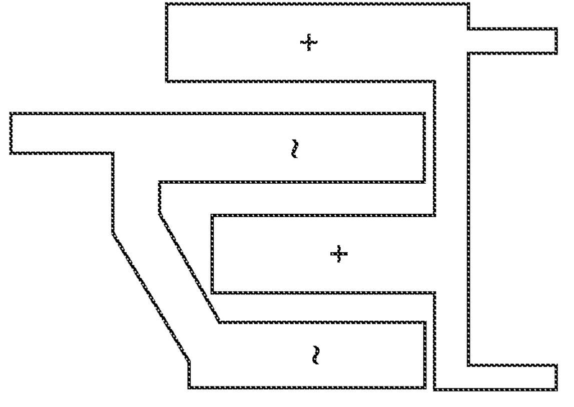
Figure 9A:
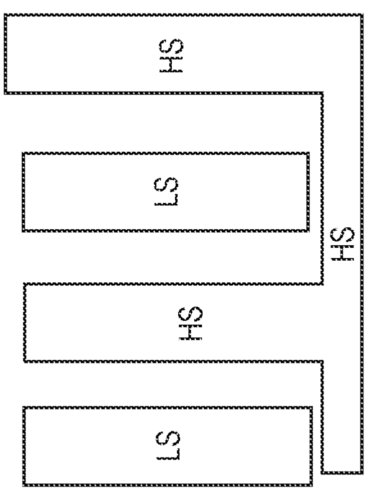
Figure 10C:
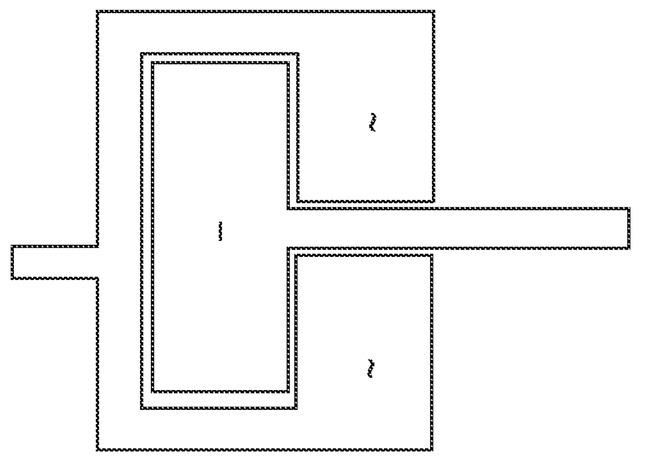
Figure 10C:
Figure 10B:
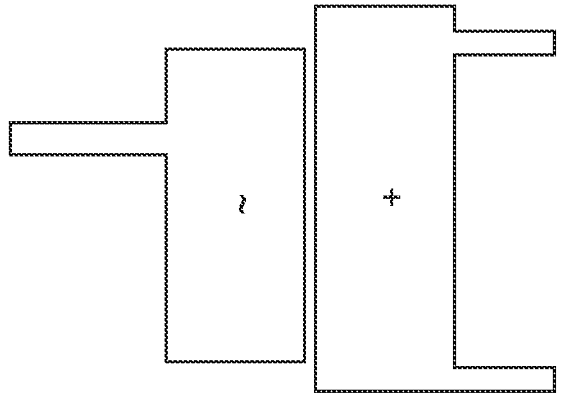
Figure 10A:
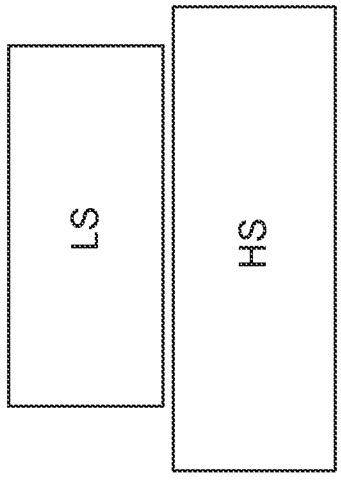

FIG. 5A illustrates the same view as FIG. 1C, but schematically shows the low-side (LS) and high-side (HS) half bridge switch devices 200, 202 formed by the first vertical power transistor dies 120 and the second vertical power transistor dies 122, respectively, superimposed on the first substrate 102. FIG. 5B is similar to FIG. 5A, but with the high-side current path (+) and the phase current path (~) superimposed on the first substrate 102. FIG. 5C is similar to FIG. 5B, but with the low-side current path (–) and the phase current path (~) superimposed on the second substrate 106.

Each of FIGS. 6A, 7A, 8A, 9A and 10A schematically shows different configurations for the low-side (LS) and high-side (HS) switch devices 200, 202 formed by the first vertical power transistor dies 120 and the second vertical power transistor dies 122, respectively. Each of FIGS. 6B, 7B, 8B, 9B and 10B schematically shows corresponding different configurations for the high-side current path (+) and the phase current path (~) related to the first substrate 102. Each of FIGS. 60, 7C, 8C, 9C and 10C schematically shows corresponding different configurations for the low-side current path (–) and the phase current path (~) related to the second substrate 106. The patterned first metallization 104 of the first substrate 102 and the patterned second metallization 108 of the second substrate 106 can be designed/patterned accordingly to accommodate the different switch device and current path configurations shown in FIGS. 6A-6C, 7A-7C, 8A-8C, 9A-9C and 10A-10C. More generally, the substrate metallizations 104, 108 that face one another may be patterned to accommodate any desired layout for the first and second vertical power transistor dies 120, 122 included in the power module 100.

The upper part of FIG. 11A illustrates a top perspective view of the multi-level lead frame 140 included in the power module 100 and the lower part of FIG. 11A illustrates a corresponding side view of the multi-level lead frame 140, before separation of the leads 146, 148, 150, 152, 160, 166, 176, 180, 184, 186 from a frame 1100 of the multi-level lead frame 140. The frame 1100 enables easier handling of the multi-level lead frame 140 by automatic assembly equipment. Features of the multi-level lead frame 140 such as the leads 146, 148, 150, 152, 160, 166, 176, 180, 184, 186 may be formed by stamping, punching, etching, etc. The multi-level lead frame 140 may be formed and processed as a single unit or may be one of a plurality of leaf frame units that are interconnected and processed in parallel. The thickness of the multi-level lead frame 140 may range, e.g., from 0.1 mm to 1 mm or thicker.

The upper part of FIG. 11B illustrates a top perspective view of the multi-level lead frame 140 included in the power module 100 and the lower part of FIG. 11B illustrates a corresponding side view of the multi-level lead frame 140, after separation of the leads 146, 148, 150, 152, 160, 166, 176, 180, 184, 186 from the frame 1100. The separation may be performed by stamping, punching, etching, etc. The distal ends of the leads 146, 148, 150, 152, 160, 166, 176, 180, 184, 186 are bent in the z direction in FIG. 11B, to yield respective final lead configurations used in the power module 100.

As shown in FIGS. 11A and 11B, the substrate attachment end of some leads 148, 152, 160, 166, 176, 184, 186 of the multi-level lead frame 140 are at a first (lower) level 'L1' which corresponds to the patterned first metallization 104 of the first substrate 102. The substrate attachment end of other leads 146, 180 of the multi-level lead frame 140 are bent in the z direction so as to be positioned at a second (upper) level 'L2' which corresponds to the patterned second metallization 108 of the second substrate 106. The lead 150 of the multi-level lead frame 140 that provides the phase current path (AC) has a split substrate attachment end in FIGS. 11A and 11B. The split end of the phase current path lead 150 includes a first part 300 at the lower level L1 for attachment to the patterned first metallization 104 of the first substrate 102 and a second part 302 at the upper level L2 for attachment to the patterned second metallization 108 of the second substrate 106.

The difference between the first and second levels L1, L2 corresponds to the vertical (z direction) space or gap between the patterned first metallization 104 of the first substrate 102 and the patterned first metallization 104 of the first substrate 102. The magnitude of the vertical space or gap corresponds to the height (thickness) of the vertical power transistor dies 102, 122 plus the height (thickness) of the die spacers 130, 138. The height (thickness) of the die spacers 130, 138 may be chosen to ensure adequate clearance for the gate bond wires 172, 174.

FIG. 12 illustrates a partial cross-sectional view of the power module 100. An outline of the mold body 114 is shown in FIG. 12, so that the internal module components are visible. In FIG. 12, the proximal (substrate attachment) end of the lead 150 of the multi-level lead frame 140 that provides the phase current path (AC) has a split configuration to enable attachment of the phase current path lead 150 to both the patterned first metallization 104 of the first substrate 102 and the patterned second metallization 108 of the second substrate 106. The split end of the phase current path lead 150 has a first part 300 at the lower level L1 that is attached to the first part 124 of the patterned first metallization 104 of the first substrate 102 and a second part 302 at the upper level L2 that is attached to the second part 136 of the patterned second metallization 108 of the second substrate 106. The second part 302 of the split end of the phase current path lead 150 has a transition zone 1200 that is bent at an angle α such as 30° with a range of −15°/+60° to accommodate the height transition from the lower level L1 that corresponds to the patterned first metallization 104 of the first substrate 102 to the upper level L2 that corresponds to the patterned second metallization 108 of the second substrate 106.

FIG. 13 illustrates a partial cross-sectional view of the power module 100, according to another embodiment. An outline of the mold body 114 is shown in FIG. 13, so that the internal module components are visible. In FIG. 13, the proximal (substrate attachment) end of the lead 150 of the multi-level lead frame 140 that provides the phase current path (AC) has a bent end 1300 to enable attachment of the phase current path lead 150 to both the patterned first metallization 104 of the first substrate 102 and the patterned second metallization 108 of the second substrate 106. The bent end 1300 of the phase current path lead 150 has a first part 1302 at the first (lower) level L1 and attached to the first part 124 of the patterned first metallization 104 of the first substrate 102. The bent end 1300 of the phase current path lead 150 also has a second part 1304 that transitions to the second (upper) level L2 and is attached to the second part 128 of the patterned second metallization 108 of the second substrate 106.

FIG. 14 illustrates a partial cross-sectional view of the power module 100, according to another embodiment. An outline of the mold body 114 is shown in FIG. 14, so that the internal module components are visible. In FIG. 14, the proximal (substrate attachment) end 1400 of the lead 150 of the multi-level lead frame 140 that provides the phase current path (AC) has an increased thickness (T2>T1) compared to a part 1402 of the lead 150 joining the proximal end 1400. A first (lower) side 1404 of the proximal end 1400 is attached to the first part 124 of the patterned first metallization 104 of the first substrate 102 and a second (upper) side 1406 of the proximal end 1400 opposite the first side 1404 is attached to the second part 128 of the patterned second metallization 108 of the second substrate 106. In one embodiment, the proximal end 1400 of the phase current path lead 150 includes a stack of two or more metallic layers, with a lowermost metallic layer 1408 being attached to the first part 124 of the patterned first metallization 104 of the first substrate 102 and an uppermost metallic layer 1410 being attached to the second part 128 of the patterned second metallization 108 of the second substrate 106.

The metallic layers 1408, 1410 of the stack may be formed by joining different lead frames by an electrically conductive joining material 1412 such as solder, welding, sintering, gluing, mechanical fixing (e.g., screw, clamp, rivet, etc.), etc. The separate lead frames may be connected inside or outside of the mold body 114.

Although the present disclosure is not so limited, the following numbered examples demonstrate one or more aspects of the disclosure.

Example 1. A power module, comprising: a first substrate comprising a patterned first metallization; a second substrate comprising a patterned second metallization that faces the patterned first metallization; a first plurality of vertical power transistor dies having a drain pad attached to a first part of the patterned first metallization and a source pad electrically connected to a first part of the patterned second metallization; a second plurality of vertical power transistor dies having a drain pad attached to a second part of the patterned first metallization and a source pad electrically connected to a second part of the patterned second metallization; and a lead frame between the first substrate and the second substrate, wherein the first plurality of vertical power transistor dies and the second plurality of vertical power transistor dies form a half bridge, wherein the lead frame comprises: a first lead attached to the first part of the patterned second metallization and providing a low-side current path to the half bridge; a second lead attached to the second part of the patterned first metallization and providing a high-side current path to the half bridge; and a third lead attached to both the first part of the patterned first metallization and the second part of the patterned second metallization, and providing a phase current path to the half bridge.

Example 2. The power module of example 1, wherein: the drain of each vertical power transistor die in a first subset of the second plurality of vertical power transistor dies is attached to a first segment of the second part of the patterned first metallization and the drain of each vertical power transistor die in a second subset of the second plurality of vertical power transistor dies is attached to a second segment of the second part of the patterned first metallization; the first part of the patterned first metallization is laterally interposed between the first segment and the second segment of the second part of the patterned first metallization; the second lead is attached to the first segment of the second part of the patterned first metallization; the lead frame further comprises a fourth lead attached to the second segment of the second part of the patterned first metallization; the second lead provides the high-side current path to the first subset of the second plurality of vertical power transistor dies; and the fourth lead provides the high-side current path to the second subset of the second plurality of vertical power transistor dies.

Example 3. The power module of example 2, wherein the first plurality of vertical power transistor dies is flanked on a first side by the first subset of the second plurality of vertical power transistor dies, and wherein the first plurality of vertical power transistor dies is flanked on a second side opposite the first side by the second subset of the second plurality of vertical power transistor dies.

Example 4. The power module of example 2 or 3, wherein the first segment and the second segment of the second part of the patterned first metallization are interconnected by an additional part of the patterned first metallization.

Example 5. The power module of any of examples 1 through 4, wherein the third lead has a split end with a first part of the split end attached to the first part of the patterned first metallization and a second part of the split end attached to the second part of the patterned second metallization.

Example 6. The power module of any of examples 1 through 4, wherein the third lead has a bent end with a first part of the bent end at a first level and attached to the first part of the patterned first metallization and a second part of the bent end at a second level different than the first level and attached to the second part of the patterned second metallization.

Example 7. The power module of any of examples 1 through 4, wherein a proximal end of the third lead has an increased thickness compared to a part of the third lead joining the proximal end, and wherein a first side of the proximal end is attached to the first part of the patterned first metallization and a second side of the proximal end opposite the first side is attached to the second part of the patterned second metallization.

Example 8. The power module of example 7, wherein the proximal end of the third lead comprises a stack of two or more metallic layers, wherein a lowermost one of the two or more metallic layers is attached to the first part of the patterned first metallization and an uppermost one of the two or more metallic layers is attached to the second part of the patterned second metallization.

Example 9. The power module of any of examples 1 through 8, wherein the first lead is attached to the first part of the patterned second metallization by solder, wherein the second lead is attached to the second part of the patterned first metallization by solder, and wherein the third lead is attached to both the first part of the patterned first metallization and the second part of the patterned second metallization by solder.

Example 10. The power module of any of examples 1 through 9, wherein the lead frame further comprises a first gate lead attached to a third part of the patterned first metallization and a second gate lead attached to a fourth part of the patterned first metallization, wherein a gate pad of the first plurality of vertical power transistor dies is electrically connected to the third part of the patterned first metallization, and wherein a gate pad of the second plurality of vertical power transistor dies is electrically connected to the fourth part of the patterned first metallization.

Example 11. The power module of any of examples 1 through 10, wherein the lead frame further comprises a first sense lead attached to the second part of the patterned first metallization and a second sense lead attached to the first part of the patterned second metallization.

Example 12. A power module, comprising: a first substrate comprising a patterned first metallization; a second substrate comprising a patterned second metallization that faces the patterned first metallization; a first plurality of vertical power transistor dies having a drain pad attached to a first part of the patterned first metallization and a source pad electrically connected to a first part of the patterned second metallization; a second plurality of vertical power transistor dies having a drain pad attached to a second part of the patterned first metallization and a source pad electrically connected to a second part of the patterned second metallization; and a multi-level lead frame between the first substrate and the second substrate and attached to each of the first part of the patterned first metallization, the first part of the patterned second metallization, the second part of the patterned first metallization, and the second part of the patterned second metallization.

Example 13. A power module, comprising: a first substrate comprising a patterned first metallization; a second substrate comprising a patterned second metallization that faces the patterned first metallization; a first plurality of vertical power transistor dies forming a low-side switch of a half bridge and having a drain pad attached to a first part of the patterned first metallization and a source pad electrically connected to a first part of the patterned second metallization; a second plurality of vertical power transistor dies forming a high-side switch of the half bridge and having a drain pad attached to a second part of the patterned first metallization and a source pad electrically connected to a second part of the patterned second metallization; and a multi-level lead frame attached to both the patterned first metallization and the patterned second metallization and providing a low-side current path, a high-side current path, and a phase current path to the half bridge.

Terms such as “first”, “second”, and the like, are used to describe various elements, regions, sections, etc. and are also not intended to be limiting. Like terms refer to like elements throughout the description.

As used herein, the terms “having”, “containing”, “including”, “comprising” and the like are open ended terms that indicate the presence of stated elements or features, but do not preclude additional elements or features. The articles “a”, “an” and “the” are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A power module, comprising:

a first substrate comprising a patterned first metallization;

a second substrate comprising a patterned second metallization that faces the patterned first metallization;

a first plurality of vertical power transistor dies having a drain pad attached to a first part of the patterned first metallization and a source pad electrically connected to a first part of the patterned second metallization;

a second plurality of vertical power transistor dies having a drain pad attached to a second part of the patterned first metallization and a source pad electrically connected to a second part of the patterned second metallization; and a lead frame between the first substrate and the second substrate, wherein the first plurality of vertical power transistor dies and the second plurality of vertical power transistor dies form a half bridge, wherein the lead frame comprises:

a first lead attached to the first part of the patterned second metallization and providing a low-side current path to the half bridge;

a second lead attached to the second part of the patterned first metallization and providing a high-side current path to the half bridge; and a third lead attached to both the first part of the patterned first metallization and the second part of the patterned second metallization, and providing a phase current path to the half bridge.

2. The power module of claim 1, wherein:

the drain of each vertical power transistor die in a first subset of the second plurality of vertical power transistor dies is attached to a first segment of the second part of the patterned first metallization and the drain of each vertical power transistor die in a second subset of the second plurality of vertical power transistor dies is attached to a second segment of the second part of the patterned first metallization;

the first part of the patterned first metallization is laterally interposed between the first segment and the second segment of the second part of the patterned first metallization;

the second lead is attached to the first segment of the second part of the patterned first metallization;

the lead frame further comprises a fourth lead attached to the second segment of the second part of the patterned first metallization;

the second lead provides the high-side current path to the first subset of the second plurality of vertical power transistor dies; and the fourth lead provides the high-side current path to the second subset of the second plurality of vertical power transistor dies.

3. The power module of claim 2, wherein the first plurality of vertical power transistor dies is flanked on a first side by the first subset of the second plurality of vertical power transistor dies, and wherein the first plurality of vertical power transistor dies is flanked on a second side opposite the first side by the second subset of the second plurality of vertical power transistor dies.

4. The power module of claim 2, wherein the first segment and the second segment of the second part of the patterned first metallization are interconnected by an additional part of the patterned first metallization.

5. The power module of claim 1, wherein the third lead has a split end with a first part of the split end attached to the first part of the patterned first metallization and a second part of the split end attached to the second part of the patterned second metallization.

6. The power module of claim 1, wherein the third lead has a bent end with a first part of the bent end at a first level and attached to the first part of the patterned first metallization and a second part of the bent end at a second level different than the first level and attached to the second part of the patterned second metallization.

7. The power module of claim 1, wherein a proximal end of the third lead has an increased thickness compared to a part of the third lead joining the proximal end, and wherein a first side of the proximal end is attached to the first part of the patterned first metallization and a second side of the proximal end opposite the first side is attached to the second part of the patterned second metallization.

8. The power module of claim 7, wherein the proximal end of the third lead comprises a stack of two or more metallic layers, wherein a lowermost one of the two or more metallic layers is attached to the first part of the patterned first metallization and an uppermost one of the two or more metallic layers is attached to the second part of the patterned second metallization.

9. The power module of claim 1, wherein the first lead is attached to the first part of the patterned second metallization by solder, wherein the second lead is attached to the second part of the patterned first metallization by solder, and wherein the third lead is attached to both the first part of the patterned first metallization and the second part of the patterned second metallization by solder.

10. The power module of claim 1, wherein the lead frame further comprises a first gate lead attached to a third part of the patterned first metallization and a second gate lead attached to a fourth part of the patterned first metallization, wherein a gate pad of the first plurality of vertical power transistor dies is electrically connected to the third part of the patterned first metallization, and wherein a gate pad of the second plurality of vertical power transistor dies is electrically connected to the fourth part of the patterned first metallization.

11. The power module of claim 1, wherein the lead frame further comprises a first sense lead attached to the second part of the patterned first metallization and a second sense lead attached to the first part of the patterned second metallization.

12. A power module, comprising:

a first substrate comprising a patterned first metallization;

a second substrate comprising a patterned second metallization that faces the patterned first metallization;

a first plurality of vertical power transistor dies having a drain pad attached to a first part of the patterned first metallization and a source pad electrically connected to a first part of the patterned second metallization;

a second plurality of vertical power transistor dies having a drain pad attached to a second part of the patterned first metallization and a source pad electrically connected to a second part of the patterned second metallization; and a multi-level lead frame between the first substrate and the second substrate and attached to each of the first part of the patterned first metallization, the first part of the patterned second metallization, the second part of the patterned first metallization, and the second part of the patterned second metallization.

13. A power module, comprising:

a first substrate comprising a patterned first metallization;

a second substrate comprising a patterned second metallization that faces the patterned first metallization;

a first plurality of vertical power transistor dies forming a low-side switch of a half bridge and having a drain pad attached to a first part of the patterned first metallization and a source pad electrically connected to a first part of the patterned second metallization;

a second plurality of vertical power transistor dies forming a high-side switch of the half bridge and having a drain pad attached to a second part of the patterned first metallization and a source pad electrically connected to a second part of the patterned second metallization; and a multi-level lead frame attached to both the patterned first metallization and the patterned second metallization and providing a low-side current path, a high-side current path, and a phase current path to the half bridge.

* * * * *